United States Patent [19]

Ananiades

[11] 3,719,830

[45] March 6, 1973

[54] LOGIC CIRCUIT

[75] Inventor: Constantine S. Ananiades, Pasadena, Calif.

[73] Assignee: Burroughs Corporation, Detroit, Mich.

[22] Filed: April 5, 1971

[21] Appl. No.: 131,070

[52] U.S. Cl. ....................307/218, 307/203, 307/299

[51] Int. Cl. ..............................................H03k 19/22

[58] Field of Search...................307/299 A, 203, 218

[56] References Cited

UNITED STATES PATENTS

| | | | |
|---|---|---|---|
| 3,629,609 | 12/1971 | Pedersen | 307/299 |
| 3,452,216 | 6/1969 | Hirsch | 307/218 |
| 3,092,729 | 6/1963 | Cray | 307/218 |
| 3,506,846 | 4/1970 | Niemann | 307/218 |
| 3,458,719 | 7/1969 | Weiss | 307/203 |

*Primary Examiner*—James W. Lawrence
*Assistant Examiner*—Harold A. Dixon
*Attorney*—Christie, Parker & Hale

[57] ABSTRACT

A logic circuit comprising a signal amplifier, a negative feedback connection from the output to the input of the amplifier, a plurality of input terminals, and a plurality of unilateral conductors coupling the respective input terminals to the amplifier so the amplifier output signal is a logical function of binary signals applied to the input terminals. The amplifier is biased to remain unsaturated in response to the binary signal swing at the input terminals, and the negative feedback connection is designed to introduce negligible delay. In an AND gate, the amplifier is a multi-emitter transistor and the unilateral conductors are the emitter-to-base junctions of the transistor. In an OR gate, the amplifier is a transistor and the unilateral conductors are emitter-follower transistor stages coupling the respective input terminals to the emitter of the transistor amplifier.

24 Claims, 7 Drawing Figures

INVENTOR.
CONSTANTINE S. ANANIADES
BY
Christie, Parker & Hale
ATTORNEYS

LOGIC CIRCUIT

BACKGROUND OF THE INVENTION

This invention relates to electrical circuits and, more particularly, to a logic circuit that is well suited for use as a basic building block in the implementation of binary logical operations and is well suited for fabrication as an integrated circuit.

Among the many available types of basic logic circuits packaged in integrated circuits are emitter-coupled logic (ECL), direct-coupled transistor logic (DCTL), diode-transistor logic (DTL), transistor-transistor logic (TTL), and complementary transistor logic (CTL). To perform complex logical operations such as those required in a digital computer, the basic logic circuits are electrically connected in long chains. The signal at the output of the chain is a logical function of the propagation delay in the binary signals applied to the inputs of the chain. Because of these long chains of logic circuits, the delay time associated with each logic circuit becomes a significant factor in the speed of operation of the equipment. Further, the binary output signal swing of each logic circuit must be greater than the binary input signal swing in order to prevent deterioration of the signals propagating through long chains and to provide an adequate noise margin.

In selecting the particular type of basic logic circuit to be used, the advantages and disadvantages of the various types must be considered. In some types of logic circuits such as DCTL and TTL, the transistors are saturated in one binary state. This has the disadvantage of increasing the delay time for the logic circuit. In other types of logic circuits, such as ECL, the transfer characteristic, i.e., the output signal as a function of the input signal, is stepped, i.e., the transition from one binary value to the other at the output occurs in response to a very small change of the signal at the input. This has the disadvantage of increasing the delay time of the logic circuit and, in addition, gives rise to circuit ringing due to the reactive interaction between adjacent logic circuits. Although the CTL type of logic circuit has a sloped rather than a stepped transfer characteristic and does not involve saturated transistors, its transfer characteristic is attenuating, i.e., the binary signal swing at the output is smaller than the binary signal swing at the input. It is an important advantage of a logic circuit to have a wired-OR capability, i.e., to be able to perform the logical OR function without a separate logic circuit by directly wiring together the logic circuit outputs to be ORed. Logic circuits such as TTL and some ECL do not have a wired-OR capability. From the point of view of packaging a logic circuit as an integrated circuit, it is advantageous to employ transistors of the same conductivity type. Some logic circuits, such as CTL, are implemented with transistors of complementary conductivity types. From the point of view of ease of design and visualization, it is advantageous to work with logic circuits that perform direct logical functions, i.e., AND and OR, rather than complementary logical functions, i.e., NAND and NOR.

The following articles in the literature teach the use of delayed negative feedback to reduce propagation delay time in a current switch: "Achieving Subnanosecond Delays Using Feedback with the Current Switch" by L. Weiss, IEEE Journal of Solid-State Circuits, Vol. SC–1, No. 2, Dec. 1966, pp 86 through 94; Monolithic Sub-Nanosecond Switch by L. Weiss, 1966 International Solid-State Circuits Conference, pp 8 and 9; and "Feed-back Current Switching Circuits: General Concepts" by K. F. Mathews and L. Weiss, 1970 IEEE International Convention Digest, pp 254, 255. Specifically, the reference voltage of the switch is changed by the negative feedback after switching takes place to shift the reference voltage nearer to the level of the input signal. Thus, the negative feedback connection introduces substantial delay relative to the switching time of the input signal. In other words, the rise time of the input signal is smaller than the delay, so the feedback is not effective until the input signal switches. Further, the gain or transfer characteristic is a complicated function of the circuit parameters.

SUMMARY OF THE INVENTION

The invention concerns a basic logic circuit that has all of the above enumerated advantages, and none of the disadvantages. The logic circuit comprises a signal amplifier, a negative feedback connection with negligible delay from the output to the input of the amplifier, a plurality of input terminals, and a plurality of unilateral conductors coupling the respective input terminals to the amplifier so the amplifier output signal is a logical function of the binary signals at the input terminals. In operation, the amplifier remains unsaturated in both binary states, i.e., the low level and the high level. As a result of the negative feedback connection, the transfer characteristic is sloped rather than stepped, and amplifying rather than attenuating. The amplification of the transfer characteristic is adjusted by the feedback factor to provide the desired noise margin. Preferably, the amplification is set just high enough so the output of the amplifier is at a level above the high level by an amount slightly greater than the given maximum noise level when the logical function is satisfied by the signals at the input terminals and is at a level below the low level by an amount slightly greater than the given maximum noise level when the logical function fails to be satisfied by the signals at the input terminals. The negative feedback connection introduces a delay that is negligible relative to the switching time of the signals applied to the input terminals, so the negative feedback is effective while the input signals are switching from one binary value to another. Consequently, it is not necessary to design the interconnections between successive gates in a chain so the rise time of the input signals remains smaller than the delay of the feedback connection. This simplifies circuit design and reduces cost.

In an AND gate, the amplifier may be a multi-emitter transistor and the unilateral conductors are the emitter-to-base junctions of the multi-emitter transistor. In an OR gate, the amplifier may be a transistor and the unilateral conductors are input emitter-follower transistor stages coupled between the input terminals and the emitter of the transistor amplifier. In both gates, the collector of the transistor amplifier is coupled by an output emitter-follower transistor stage to an output terminal. The output terminal is preferably clamped to a low reference potential when the current flowing through the output emitter-follower transistor stage drops below a predetermined minimum value. Both gates have a wired-OR capability, are constructed from transistors of the same conductivity type, and perform a direct logical function.

The feedback connection is preferably a voltage divider comprising a first direct ohmic connection between the collector and the base of the transistor amplifier and a second ohmic connection between the base of the transistor amplifier and a reference potential. This simplifies the transfer characteristic, in that the voltage amplification of the logic circuit in the transition between the two binary states is essentially equal to the ratio of the sum of the first and second ohmic connections over the first ohmic connection. This ratio, and thus the transfer characteristic, can be closely controlled by use of known integrated circuit fabricating techniques. As a feature of the invention, the first ohmic connection is a resistor and diode in series, across which the emitter and collector terminals of a transistor are shunted. The diode is selected to produce between the collector and base of the transistor amplifier a voltage drop substantially equal to and opposite from the voltage drop between the collector of the transistor amplifier and the output terminal. As a result, the diode compensates for the voltage drop introduced by the output emitter-follower stage as the current flowing through the collector of the transistor amplifier approaches its minimum value. The shunting transistor is biased to remain cut off until the current flowing through the collector of the transistor amplifier approaches its maximum value. When the transistor amplifier begins to conduct, the resistor and diode in series become ineffectual and the slope of the transfer characteristic steepens as the current increases toward its maximum value.

BRIEF DESCRIPTION OF THE DRAWINGS

The features of several specific embodiments of the best mode contemplated of carrying out the invention are illustrated in the drawings, in which.

DETAILED DESCRIPTION OF THE SPECIFIC EMBODIMENTS

Figure 1:
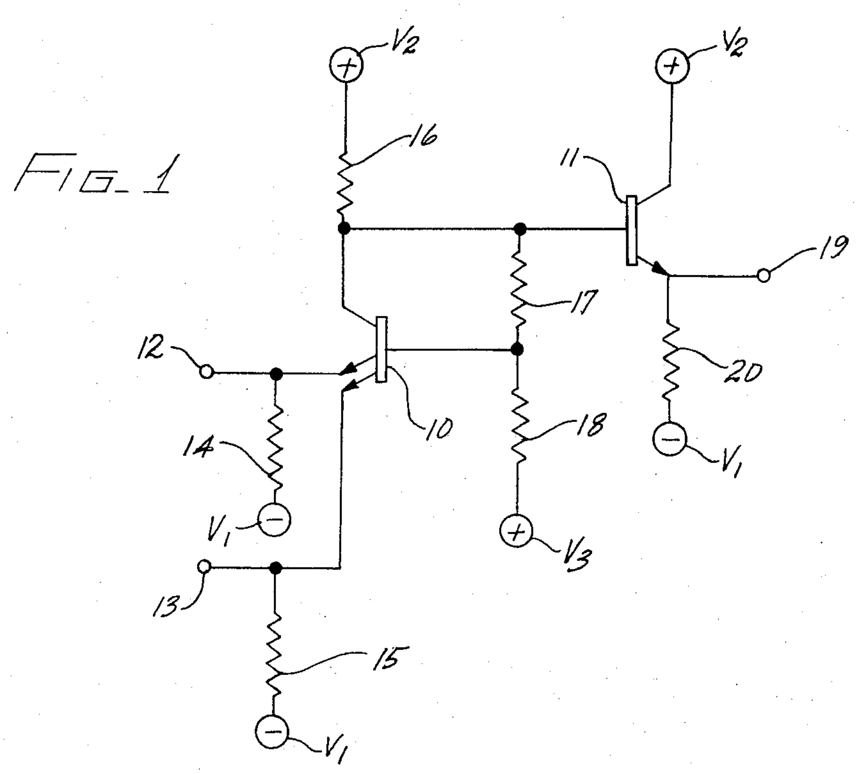
FIG. 1 is a schematic circuit diagram of one embodiment of an AND gate incorporating the principles of the invention.

In FIG. 1, an AND gate according to the invention comprises a multi-emitter transistor 10 and an output emitter-follower transistor stage 11 both of the NPN conductivity type. Multi-emitter transistor 10 has a plurality of emitter terminals, a single base terminal, a single collector terminal, a plurality of emitter-to-base junctions, and a single base-to-collector junction coupled to all the emitter-to-base junctions by a single base region. Instead of a multi-emitter transistor, other transistor means having a plurality of emitters could be used, e.g., a plurality of standard single-emitter transistors having their bases connected together and their collectors connected together. Input terminals 12 and 13 are directly connected to the respective emitters of transistor 10. A resistor 14 connects input terminal 12 to a source $V_1$ of negative bias potential and a resistor 15 connects input terminal 13 to source $V_1$. A resistor 16 connects the collector of transistor 10 to a source $V_2$ of positive bias potential. Resistors 14 and 15 are identical. The collector of transistor 10 is also directly connected by a resistor 17 to the base of transistor 10, and the base of transistor 10 is connected by a resistor 18 to a source $V_3$ of positive bias potential smaller than the potential of source $V_2$.

Sources $V_1$ and $V_3$ furnish a non-saturating forward bias between each emitter of transistor 10 and the base thereof. Sources $V_2$ and $V_3$ furnish a reverse bias between the collector and base of transistor 10. Resistors 17 and 18 comprise a voltage divider that forms a negative feedback connection from the collector of transistor 10 to its base. As the potential at the collector of transistor 10 increases, this increase is opposed by the feedback potential at the base of transistor 10. Consequently, the voltage amplification of transistor 10 is reduced substantially, but is larger than unity.

The collector of transistor 10 is directly connected to the base of transistor stage 11. The collector of transistor stage 11 is directly connected to source $V_2$ and the emitter of transistor stage 11 is directly connected to an output terminal 19. In addition, the emitter of transistor stage 11 is coupled by a resistor 20 to source $V_1$. Sources $V_2$ and $V_1$ bias transistor stage 11 so transistor stage 11 operates as an emitter-follower without becoming cut off or saturated at any time. The signal at output terminal 19 follows the signal at the collector of transistor 10 except for the small base-to-emitter voltage drop of transistor 11.

The emitter-to-base junctions of transistor 10 perform the logical AND function with respect to the binary signals applied to input terminals 12 and 13. When the signal applied to input terminal 12 and/or 13 is below a predetermined low input level, the corresponding emitter-to-base junction or junctions of transistor 10 are forward biased, the collector of transistor 10 is at a predetermined low level, and output terminal level 19 is at a predetermined low output level slightly below the level at the collector of transistor 10. When the binary signals applied to input terminals 12 and 13 are both above a predetermined high input level, both emitter-to-base junctions of transistor 10 are cut off, the collector of transistor 10 is a predetermined high level, and output terminal 19 is at a predetermined high output level slightly below the level at the collector of transistor 10. Thus, the logic circuit performs a direct AND function. For signals at input terminals 12 and 13 between the predetermined high and low input levels, the level at output terminal 19 varies in approximately linear fashion, i.e., the logic circuit has a sloping transfer characteristic. In summary, the emitter-to-base junctions of transistor 10 perform the logical AND function, transistor 10 as a whole with its negative feedback connection provides a controlled amplification, and stage 11 isolates output terminal 19 from the remainder of the logic circuit.

Figure 7:
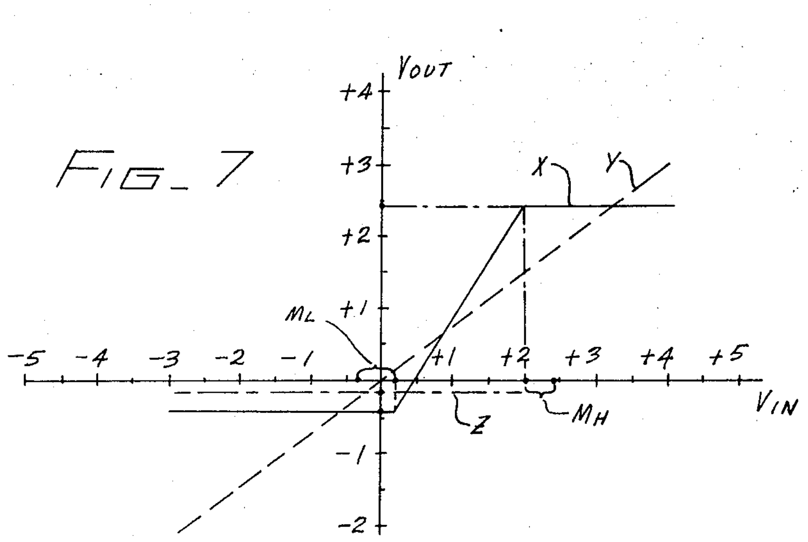
FIG. 7 is a graph of a typical transfer characteristic of the logic circuit according to the invention.

Reference is made to FIG. 7 for a graph of a typical transfer characteristic of the logic circuit of FIG. 1. The abscissa $V_{in}$ represents the signal level in volts at input terminal 12 and, assuming that the signal level at input terminal 13 is above the predetermined high input level (+2.0 volts), the ordinate $V_{out}$ represents the signal level in volts at output terminal 19. A solid line X represents the actual transfer characteristic of the logic circuit, and a dashed line Y represents the unity amplification slope. When the signal level at input terminal 12 is below the predetermined low input level, i.e., + 0.2 volts, output terminal 19 is at the predetermined low output level, i.e., at − 0.4 volts. When the signal level at input terminal 12 is above the predetermined high input level, i.e., + 2.0 volts, output terminal 19 is at the predetermined high output level, i.e., + 2.4 volts. When the signal level at input terminal 12 is between + 0.2 volts and + 2.0 volts, the signal level at output terminal 19 varies in approximately linear relationship with the signal level at input terminal 12. By comparison of transfer characteristic X with slope Y, it can be seen that the circuit of FIG. 1 has a sloped amplifying transfer characteristic between the predetermined high and low input levels. The predetermined high output level is above the predetermined high input level by 0.4 volts, as represented by the bracketed portion $M_H$ on the abscissa. Similarly, the predetermined low output level is below the predetermined low input level by 0.6 volts, as represented by the bracketed portion $M_L$ on the abscissa. The difference between the predetermined output and input levels represents the noise margin for which the logic circuit is designed. Accordingly, the output signal of the logic circuit is binary in nature as long as the noise level of the signals at input terminals 12 and 13 does not exceed the noise margin. If the noise margin is exceeded, the input level moves into the sloping region of the transfer characteristic and the output level becomes indefinite in its binary representation, which is undesired in binary operation.

The predetermined high output level at output terminal 19 is determined by the potential of sources $V_2$ and $V_3$ and the resistance ratio of resistors 16, 17, and 18. Similarly, the predetermined low output level at output terminal 19 is determined by the potential of sources $V_2$ and $V_1$ and the resistance ratio of resistors 16 and 14. The amplification between the predetermined high and low levels is determined by the resistance ratio of resistors 17 and 18 and is approximately given by the sum of the resistance of resistors 17 and 18 over the resistance of resistor 17. The lateral position of the transfer characteristic, i.e., the point of intersection with the abscissa, is determined by the potential of source $V_3$. Thus, the various characteristics of the logic circuit, such as its transfer characteristic, noise margin, noise sensitivity, threshold point, high level point, and low level point, can all be adjusted to meet the particular application and the logic circuit can be packaged in integrated circuits having stable characteristics because these characteristics depend upon resistance ratios.

The amplification of the logic circuit is controlled by the negative feedback connection (resistors 17 and 18) so the predetermined high output level is above the predetermined high input level by an amount only slightly greater than the maximum noise level and the predetermined low output level is below the predetermined low input level by an amount only slightly greater than the maximum noise level. In this way, the sloping portion of the transfer characteristic is as near to the unity amplification slope as possible for the required noise margin. Consequently, the logic circuit has the smallest possible time delay and circuit ringing is minimized. The delay introduced by the feedback connection (resistors 17 and 18) is negligible, or at least very small, relative to the rise time of the signals applied to input terminals 12 and 13. Thus, the negative feedback is instantaneously effective, i.e., effective while the input signals are switching between binary values.

Figure 2:
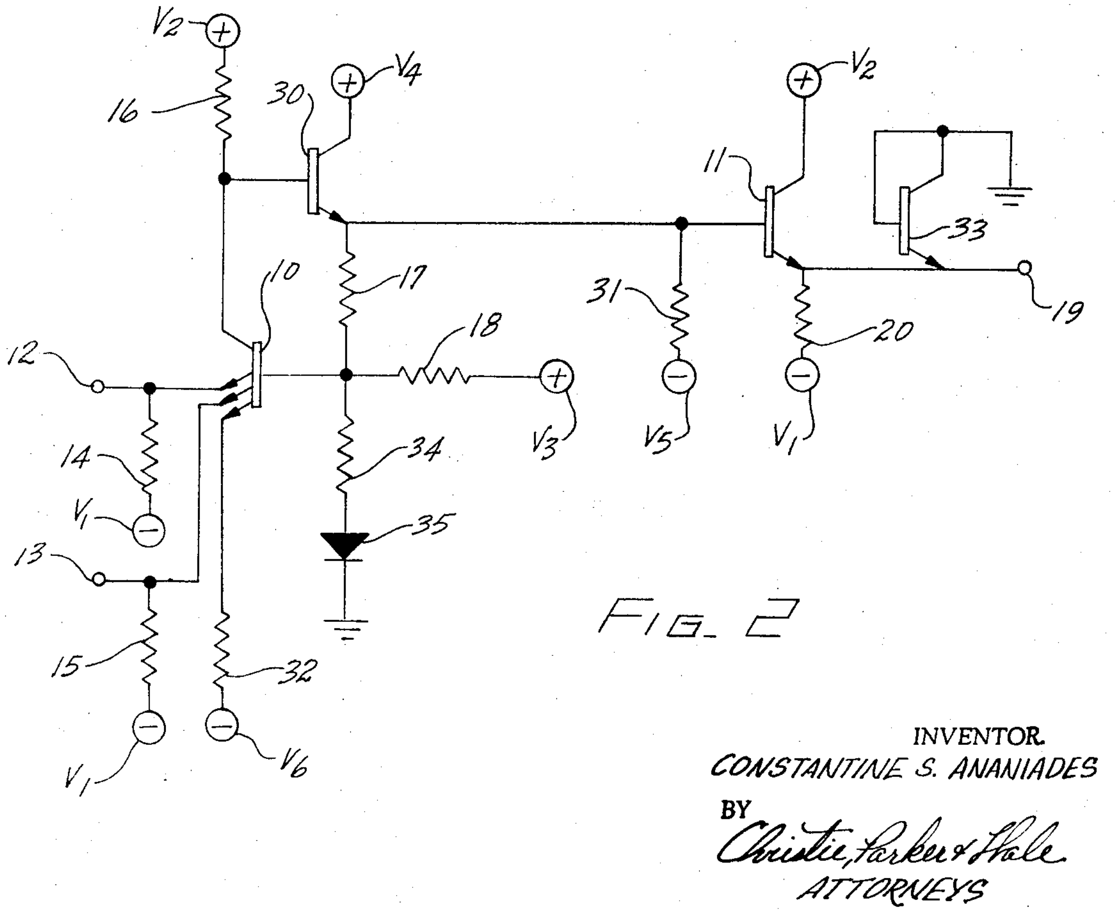
FIG. 2 is a schematic circuit diagram of a second embodiment of an AND gate incorporating the principles of the invention.

In FIG. 2, a modification of the AND gate of FIG. 1 is shown. The same reference numerals are used to designate common elements. An emitter-follower transistor stage 30 couples the collector of transistor stage 10 to the base of emitter-follower stage 11. The base of stage 30 is connected to the collector of transistor stage 10, the emitter of stage 30 is connected to resistor 17, and the collector of stage 30 is connected to a source $V_4$ of positive bias potential. A source $V_5$ of negative bias potential is coupled to the base of transistor stage 11 by a resistor 31 to provide a proper voltage level between stages 30 and 11. Stage 30 serves to isolate the collector reactance of transistor stage 10 from the remainder of the logic circuit, thereby improving the stability of the circuit. Because of the substantially constant emitter-to-base voltage drop of stage 30, resistor 17 in effect also provides a direct ohmic connection between the collector and base of the transistor stage 10 in this modification. Thus, resistor 17 is "directly connected" between the collector and base of transistor 10 as the quoted term is used in the claims. A resistor 34 and a diode 35 in series connect the base of transistor stage 10 to ground. Diode 35 serves as temperature compensation for transistor stage 10. In the embodiment of FIG. 2, the logic circuit is clamped at a predetermined high output level and at a predetermined low output level without saturating or cutting off transistor stage 10 or stages 30 and 11. At the high output level, the logic circuit is clamped by a source $V_6$ of negative bias potential, which is coupled by a resistor 32 to another emitter of transistor stage 10. Thus, there is always a minimum current flowing through the collector of transistor stage 10, depending upon the potential of source $V_6$ and the resistance of resistor 32. At the low output level, the logic circuit is clamped by a transistor 33, the emitter of which is connected to output terminal 19 and the base and collector which are connected to ground. When a given minimum current flows through stage 11, the level at output terminal 19 drops to a point at which current begins to flow from ground through transistor 33, thereby clamping output terminal 19 to a level offset from ground by the small voltage drop across transistor 33. This is represented in FIG. 7 by a dashed line Z. In this case, the level of output terminal 19 never goes below −0.2 volts. Although the noise margin is thereby somewhat reduced, the stability of the predetermined low output level is increased.

Figure 3:
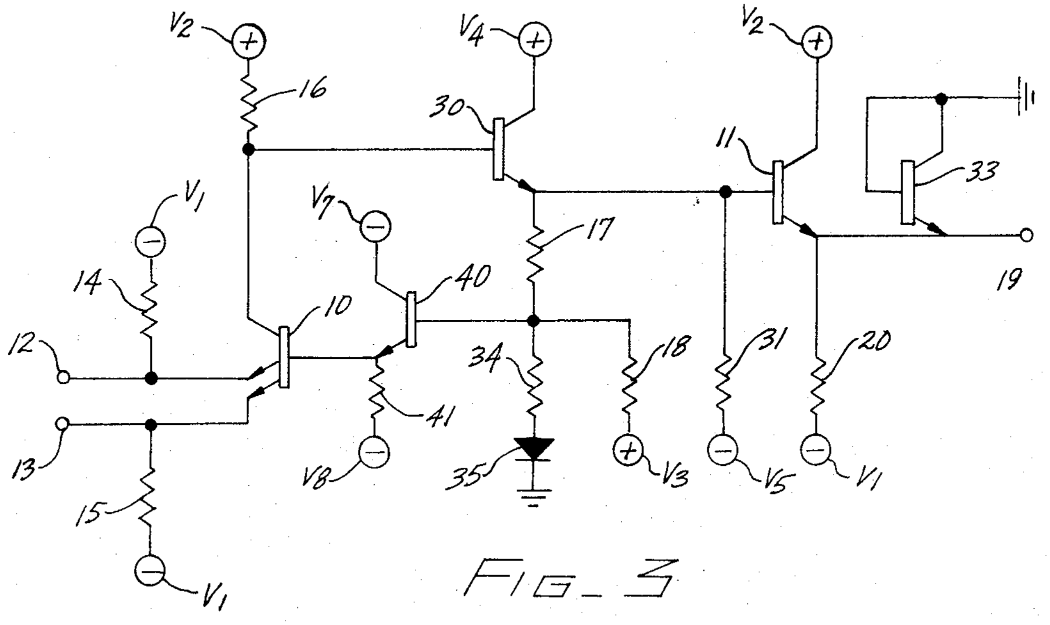
FIG. 3 is a schematic circuit diagram of a third embodiment of an AND gate incorporating the principles of the invention.

In FIG. 3, a modification of the AND gate of FIG. 2 is shown. The same reference numerals are used to designate common elements. An emitter-follower transistor stage 40 couples the junction of resistors 17 and 18 to the base of transistor stage 10. The collector of stage 40 is connected to a source $V_7$ of positive bias potential, the base of stage 40 is connected to the junction of resistors 17 and 18, and the emitter of stage 40 is connected to the base of transistor stage 10. A source $V_8$ of negative bias potential is coupled by a resistor 41 to the emitter of stage 40. Stage 40 serves to isolate the base of transistor stage 10 from the remainder of the logic circuit, thereby improving the circuit stability. Because of the substantially constant emitter-to-base voltage drop of stage 40, resistor 17 in effect also provides a direct ohmic connection between the collector and base of transistor stage 10 in this modification. Thus, resistor 17 is "directly connected" between the collector and base of transistor stage 10 as the quoted term is used in the claims.

Figures 4, 5:
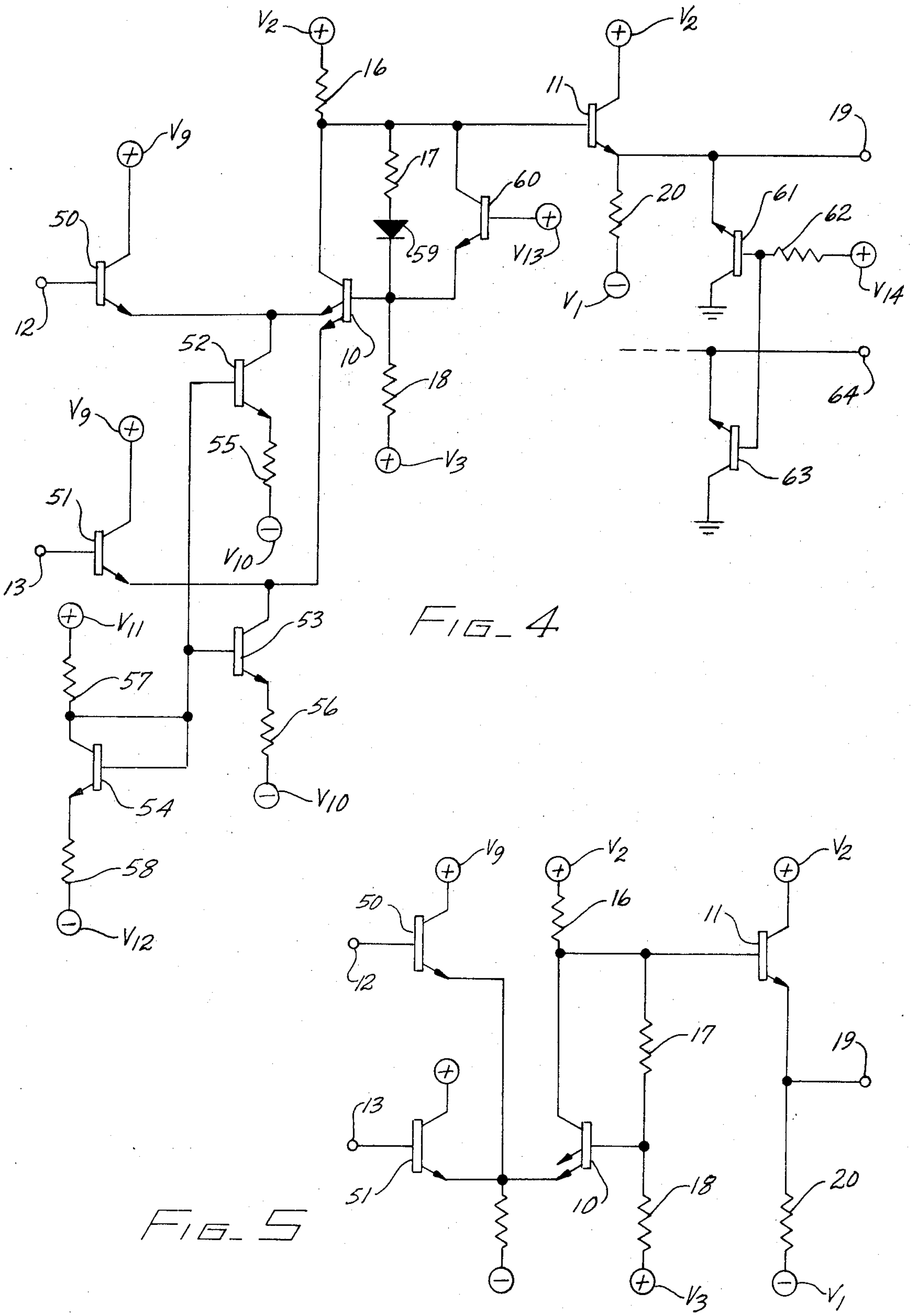
FIG. 4 is a schematic circuit diagram of a fourth embodiment of an AND gate incorporating the principles of the invention.
FIG. 5 is a schematic circuit diagram of a logic gate incorporating the principles of the invention.

In FIG. 4, another modification of the AND gate of FIG. 1 is shown. The same reference numerals are used to designate common elements. Input terminals 12 and 13 are coupled to the emitters of transistor stage 10 by input emitter-follower transistor stages 50 and 51, respectively, which present a high input impedance to the logic circuit. Transistors 52 and 53 supply constant current to the emitters of transistor stage 10. The value of the constant current is determined by a transistor 54. The bases of stages 50 and 51 are connected to input terminals 12 and 13, respectively, the collectors of stages 50 and 51 are connected to a source $V_9$ of positive bias potential, and the emitters of stages 50 and 51 are connected to the collectors of transistors 52 and 53, respectively. The emitters of transistors 52 and 53 are coupled by a resistor 55 and a resistor 56, respectively, to a source $V_{10}$ of negative bias potential and the bases of transistors 52 and 53 are connected to the base of transistor 54. The base of transistor 54 is connected to the collector of transistor 54, the collector of transistor 54 is coupled by a resistor 57 to a source $V_{11}$ of positive bias potential, and the emitter of transistor 54 is coupled by a resistor 58 to a source $V_{12}$ of negative bias potential. The potential at the base of transistor 54 determines the current that flows through the collectors of transistors 52 and 53. When the signal level at input terminal 12 and/or 13 is below the predetermined low input level, the corresponding input common-emitter transistor stage is cut off, transistor stage 10 is conducting, and output terminal 19 is at the predetermined low output level. When the signal level at input terminals 12 and 13 are both above the predetermined high input level, stages 50 and 51 are both conducting, transistor stage 10 is cut off, and output terminal 19 is at the predetermined high output level.

The amplification of the logic circuit is basically given by the voltage drop between the collector and base of transistor stage 10, since the base potential of transistor stage 10 follows the emitter potential. In other words, the amplification of the logic circuit is the sum of the voltage between the collector and base of transistor 10 and the voltage between the base of transistor 10 and source $V_3$ divided by the voltage between the base of transistor 10 and source $V_3$. A forward biased diode 59 is connected in series with resistor 17 between the collector and base of transistor stage 10 to offset the voltage drop between the base and emitter of stage 11 near the predetermined high output level of the transfer characteristic. As the voltage drop across resistor 17 decreases with decreasing current, the voltage drop across diode 59 remains essentially constant at a value substantially equal to and opposite from the voltage drop between the base and emitter of stage 11. The collector and emitter of a transistor 60 are connected between the collector and base of transistor stage 10 to shunt resistor 17 and diode 59. A source $V_{13}$ of positive bias potential is connected to the base of transistor 60. Transistor 60 provides compensation near the predetermined low output level of the transfer characteristic. The amplification of the logic circuit, i.e., the slope of the transfer characteristic, increases when transistor 60 begins to conduct, due to the drop in effective resistance between the collector and base of transistor stage 10. Transistor 60 is biased by sources $V_3$ and $V_{13}$ to be cut off until the input signal level drops to within a few tenths of a volt of the predetermined low input level. At this time, transistor 60 begins to conduct, increases the amplification, and effectively removes resistor 17 and diode 59 from the circuit.

A transistor 61 serves to clamp output terminal 19 as it approaches its predetermined low output level in the same manner as transistor 33 in FIG. 3. The emitter of transistor 61 is connected to output terminal 19. The collector of transistor 61 is connected to ground, and the base of transistor 61 is coupled by a resistor 62 to a source $V_{14}$ of positive bias potential. The base of a transistor 63, which serves as a clamp for another logic circuit having an output terminal 64, is also provided with bias by source $V_{14}$. When output terminal 19 is at the predetermined high output level, the emitter-to-base junction of transistor 61 is reverse biased and the signal level at output terminal 19 is unaffected by transistor 61. As the current through stage 11 decreases to a minimum value and the level at output terminal 19 drops to the predetermined low output level, the emitter-to-base junction of transistor 61 becomes forward biased and source $V_{14}$ saturates transistor 61. Therefore, output terminal 19 is clamped to a potential offset from ground by the voltage drop between the collector and emitter of transistor 61.

It is to be noted that the low output level clamps in FIGS. 3 and 4 both reduce the power dissipation when the logic circuit is in the low state because the required current is supplied from ground potential through transistor 33 or 61, rather than from the positive potential of source $V_2$ through transistor stage 11.

In FIG. 5, an OR gate is shown. The same reference numerals are used to designate elements in common with the logic circuits of FIGS. 1 through 4. Input terminals 12 and 13 are coupled by input emitter-follower transistor stages 50 and 51 to the same emitter of transistor stage 10. In performing the OR function, only one emitter of transistor stage 10 is employed so a single emitter-transistor would suffice, although a multi-emitter transistor is shown. When the signal levels at input terminal 12 and input terminal 13 are both below the predetermined low input level, stages 50 and 51 are both cut off, transistor stage 10 is conducting, and output terminal 19 is at the predetermined low output level. When the signal level at input terminal 12 and/or input terminal 13 is above the predetermined high input level, the corresponding input emitter-follower transistor stage is conducting, transistor stage 10 is cut off, and output terminal 19 is at the predetermined high output level. In summary, stages 50 and 51 perform the logical-OR function and transistor stage 10 with its negative feedback connection provides a controlled amplification.

Figure 6:
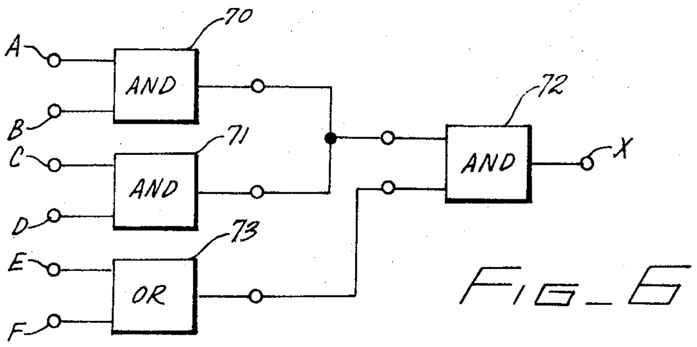
FIG. 6 is a schematic block diagram of a number of logic circuits according to the invention arranged in a chain to perform a logical function.

In FIG. 6, blocks 70, 71, and 72 represent AND gates of the type disclosed in FIGS. 1, 2, 3, or 4, and block 73 represents an OR gate of the type disclosed in FIG. 5. Each of blocks 70 through 73 has two input terminals and one output terminal. The input terminals of block 70 are designated A and B. The input terminals of block 71 are designated C and D, and the input terminals of block 73 are designated E and F. The output terminals of blocks 70 and 71 are wired directly together to perform a logical-OR function. The wired-OR capability is made possible by the isolation afforded by output emitter-follower transistor stage 11 of each logic circuit. The wired output terminals of blocks 70 and 71 are coupled to one input terminal of block 72 and the output terminal of block 73 is coupled to the other input terminal of block 72. The output terminal of block 72, which is designated X, represents the logical operation $[(A \cdot B) + (C \cdot D)] \cdot [E + F]$ in the conventional Boolean Algebraic notation.

The described embodiments of the invention are only considered to be preferred and illustrative of the inventive concept; the scope of the invention is not to be restricted to such embodiments. Various and numerous other arrangements may be devised by one skilled in the art without departing from the spirit and scope of this invention. For example, the various features disclosed in one embodiment can be employed in any of the other embodiments.

What is claimed is:

1. A logic circuit comprising:

a plurality of sources of binary data signals of a high level and a low level subject to a given maximum noise level;

signal amplifying means having an input and an output;

a plurality of input terminals to which the respective sources are connected;

a plurality of unilateral conducting means coupling the respective input terminals to the amplifying means so the signal at the output thereof is a logical function of the binary data signals at the input terminals; and a permanent negative feedback connection from the output to the input of the amplifying means, the feedback connection controlling the amplification of the amplifying means so the output of the amplifying means is at a level above the high level by an amount slightly greater than the given maximum noise level when the logical function is satisfied by the signals at the input terminals, is at a level below the low level by an amount slightly greater than the given maximum noise level when the logical function fails to be satisfied by the signals at the input terminals, and varies responsive to levels at the input terminals between the high and low levels in an approximately linear relationship near the unity amplification slope.

2. The logic circuit of claim 1, in which:

the amplifying means is a multi-emitter transistor having a plurality of emitter terminals, a base terminal, a collector terminal, a single base-to-collector junction, and a plurality of emitter-to-base junctions coupled to the base-to-collector junction by a single base region;

the unilateral conducting means are the emitter-to-base junctions of the transistor;

the input of the amplifying means is between the emitter terminals and the base terminal of the transistor; and the output of the amplifying means is between the base terminal and the collector terminal of the transistor.

3. The logic circuit of claim 1, in which:

the amplifying means is a first transistor having an emitter terminal, a base terminal, and a collector terminal serving as the output of the amplifying means;

means for biasing the first transistor to operate in non-saturating conduction for all signal conditions at the input terminals; and the unilateral conducting means are a plurality of second transistors each having an emitter terminal connected to the emitter terminal of the first transistor, a base terminal connected to one of the input terminals, a collector terminal, and means for biasing the terminals of the second transistor to form an emitter-follower, the first transistor and the second transistors being of the same conductivity type.

4. The logic circuit of claim 1, in which:

the amplifying means has a terminal common to the output and the input; and the negative feedback connection comprises a first resistor connected between the output and the common terminal and a second resistor connected between the common terminal and a reference potential.

5. The logic circuit of claim 1, in which the signal amplifying means comprises a transistor including a base terminal, a collector terminal, and a first resistor connecting the collector terminal to a reference potential and the negative feedback connection comprises a second resistor directly connecting the collector terminal to the base terminal and a third resistor connecting the base terminal to a reference potential.

6. The logic circuit of claim 1, additionally comprising an output terminal and an emitter-follower transistor stage coupling the output of the amplifying means to the output terminal.

7. The logic circuit of claim 6, additionally comprising means for clamping the output terminal to a reference potential when the current through the emitter-follower transistor stage drops below a predetermined minimum value.

8. The logic circuit of claim 7, in which the emitter-follower transistor stage has a collector, a base connected to the output of the amplifying means, an emitter, and a source of high bias potential connected between the collector and the emitter of the emitter-follower stage, the reference potential lying between the collector and emitter potentials in value to reduce the power dissipation when the clamping means is operative.

9. The logic circuit of claim 6, in which:

the amplifying means has a terminal common to the input and output; and the negative feedback connection comprises a first resistor connected between the output and the common terminal, a second resistor connected between the common terminal and a reference potential, and a shunting transistor having a collector connected to the output of the amplifying means, an emitter connected to the common terminal, and a base having a reverse bias of such magnitude that the shunting transistor remains cut off until a predetermined maximum current flows through the output of the amplifying means, the shunting transistor beginning to conduct when the predetermined maximum current is reached to increase the amplification of the amplifying means.

10. The logic circuit of claim 9, additionally comprising a forward biased diode connected in series with the first resistor between the output of the amplifying means and the common terminal, the diode being selected to produce between the output of the amplifying means and the common terminal a voltage drop substantially equal to and opposite from the voltage drop between the output of the amplifying means and the output terminal.

11. A logic circuit comprising:

transistor means having a collector terminal, a base terminal, and an emitter circuit including at least one emitter terminal;

first means for applying between the collector terminal and the base terminal a reverse bias;

second means for applying between the base terminal and at least one emitter terminal a non-saturating forward bias;

means connected to said emitter circuit of the transistor means for performing a logical function responsive to a plurality of inputs to cause the signal level at said emitter circuit of the transistor means to switch with a given rise time between a low level and a high level depending upon the satisfaction or failure of the logical function; and third means for applying between the base terminal and at least one emitter terminal of the transistor means continuous negative feedback representative of the current flowing through the collector terminal, the delay in the negative feedback being negligible relative to the rise time of the signal level at said emitter circuit of the transistor means, the third applying means comprising a first impedance and a second impedance connected in series respectively from the collector terminal to a reference potential, a junction being formed between the first and second impedances, and means for connecting the junction to the base terminal, the transfer characteristic of the transistor means being defined by the sum of the voltages across the first and second impedances divided by the voltage across the second impedance.

12. The logic circuit of claim 11, in which the means for applying negative feedback is a voltage divider comprising a first resistor connected between the collector terminal and the base terminal and a second resistor connected between the base terminal and a reference potential.

13. The logic circuit of claim 11, additionally comprising an output terminal and an emitter-follower transistor stage coupling the collector terminal of the transistor means to the output terminal, the emitter-follower transistor stage being of the same conductivity type as the transistor means.

14. The logic circuit of claim 13, additionally comprising means for clamping the output terminal to a reference potential when the current flowing through the emitter-follower transistor stage drops below a minimum value.

15. The logic circuit of claim 14, in which the clamping means comprising a transistor having a grounded collector, an emitter connected to the output terminal, and a base connected to a source of forward bias.

16. The logic circuit of claim 15, in which the first impedance includes a shunting transistor having a collector connected to the collector terminal of the transistor means, an emitter connected to the base terminal of the transistor means, and a base having a reverse bias of such magnitude that the shunting transistor is cut off until a predetermined maximum current flows through the collector terminal of the transistor means, the shunting transistor conducting above the maximum current and being of the same conductivity type as the transistor means.

17. The logic circuit of claim 16, in which the first connection includes a resistor and a diode in series between the collector and base terminals of the transistor means, the diode being selected to produce between the base terminal and the collector terminal a voltage drop substantially equal to and opposite from the voltage drop between the collector terminal and the output terminal.

18. The logic circuit of claim 17, adapted to operate upon binary data signals of a high level and a low level subject to a given maximum noise level in which the first and second biasing means are so adjusted that when the emitter terminal is above the high level the collector terminal is at a level higher than the high level by an amount slightly greater than the given maximum noise level and when the emitter terminal is below the low level the collector terminal is at a level below the low level by an amount slightly greater than the given maximum noise level, the level at the collector terminal varying in approximately linear relationship near the unity amplification slope responsive to the levels at the emitter terminal between the high and the low level.

19. A logic circuit comprising:

a primary transistor having a collector terminal, a base terminal, and an emitter terminal;

means for applying between the collector terminal and the base terminal of the primary transistor a reverse bias;

means for applying between the base terminal and the emitter terminal of the primary transistor a forward bias;

a first resistor directly connected between the collector terminal and the base terminal of the primary transistor;

a second resistor connected between the base terminal of the primary transistor and a reference potential, the first and second resistors providing negative feedback representative of the current flowing through the collector terminal;

a third resistor connected between the collector terminal and a reference potential;

a plurality of input transistors of the same conductivity type as the primary transistor, each input transistor having a collector terminal, a base terminal, and an emitter terminal;

means for connecting the emitter terminal of each of the input transistors to the emitter terminal of the primary transistor;

means for applying between the collector terminal and the base terminal of each of the input transistors a reverse bias; and means for applying between the base terminal and the emitter terminal of each of the input transistors a forward bias.

20. The logic circuit of claim 19, additionally comprising an output terminal and an emitter-follower transistor stage coupling the collector terminal of the primary transistor to the output terminal.

21. A logic circuit of claim 20, in which the primary transistor is a multi-emitter transistor.

22. The logic circuit of claim 11, in which the first impedance includes a shunting transistor having a collector connected to the collector terminal of the transistor means, an emitter connected to the base terminal of the transistor means, and a base having a reverse bias of such magnitude that the shunting transistor is cut off until a predetermined maximum current flows through the collector terminal of the transistor means, the shunting transistor conducting above the maximum current and being of the same conductivity type as the transistor means.

23. The logic circuit of claim 11, in which the emitter circuit comprises a plurality of emitter terminals equal in number to the inputs and the means to performing a logical function couples the inputs to the respective emitter terminals.

24. The logic circuit of claim 11, in which the emitter circuit comprises a single emitter terminal and the means for performing a logical function comprises a logical OR gate coupled between the inputs and the single emitter terminal.

* * * * *